(12) United States Patent
Masuoka et al.

(10) Patent No.: US 7,060,598 B2
(45) Date of Patent: Jun. 13, 2006

(54) METHOD FOR IMPLANTING IONS INTO SEMICONDUCTOR SUBSTRATE

(75) Inventors: Fujio Masuoka, Sendai (JP); Shinji Horii, Fukuyama (JP); Takuji Tanigami, Fukuyama (JP); Takashi Yokoyama, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/918,515

(22) Filed: Aug. 12, 2004

(65) Prior Publication Data

US 2005/0037600 A1    Feb. 17, 2005

(30) Foreign Application Priority Data

Aug. 12, 2003   (JP) .............................. 2003-207346

(51) Int. Cl.
*H01L 21/425*   (2006.01)
(52) U.S. Cl. ...................................... 438/515; 438/514
(58) Field of Classification Search ................ 438/514, 438/515, 524
See application file for complete search history.

(56) References Cited

U.S. PATENT DOCUMENTS

| | | | | |
|---|---|---|---|---|
| 3,726,719 A | * | 4/1973 | Brack et al. ................. | 148/1.5 |
| 4,276,477 A | * | 6/1981 | Enge .......................... | 250/398 |
| 4,533,831 A | * | 8/1985 | Itoh et al. ................. | 250/492.2 |
| 4,661,712 A | * | 4/1987 | Mobley ..................... | 250/492.2 |
| 4,861,729 A | * | 8/1989 | Fuse et al. .................. | 438/246 |
| 4,948,458 A | * | 8/1990 | Ogle .......................... | 438/729 |
| 5,075,240 A | * | 12/1991 | Yama et al. ................. | 438/227 |
| 5,141,880 A | * | 8/1992 | Inoue et al. ................ | 438/149 |
| 5,393,986 A | * | 2/1995 | Yoshinouchi et al. .. | 250/492.21 |
| 5,711,812 A | * | 1/1998 | Chapek et al. ........... | 118/723 E |
| 6,100,172 A | * | 8/2000 | Furukawa et al. .......... | 438/561 |

FOREIGN PATENT DOCUMENTS

| | | | |
|---|---|---|---|
| EP | 0532283 A1 | * | 9/1992 |
| JP | 05-114508 | | 5/1993 |
| JP | 2000-183154 | | 6/2000 |

OTHER PUBLICATIONS

M. Rhee, "Compact thomson spectrometer" Review of Sci. Instrum. vol. 55 No. 8 Aug. 1984 p. 1229-1234.*
J. Sun et al. "The effect of the elevated source/drian doping profile on performance and reliability of deep submicron mosfet's" IEEE Trans. on Electron devices vol. 44 No. 9 Sep. 1997 p. 1491-1498.*

* cited by examiner

*Primary Examiner*—Bradley K. Smith
(74) *Attorney, Agent, or Firm*—Morrison & Foerster LLP

(57) ABSTRACT

An ion implantation method for implanting ions into a side wall of a protruded semiconductor layer from a semiconductor substrate, the method includes applying an electric field to accelerate the ions in one direction and applying a magnetic field parallel to a plane extending at a predetermined angle with respect to the one direction, thereby controlling a direction of the ion implantation to the side wall.

15 Claims, 11 Drawing Sheets

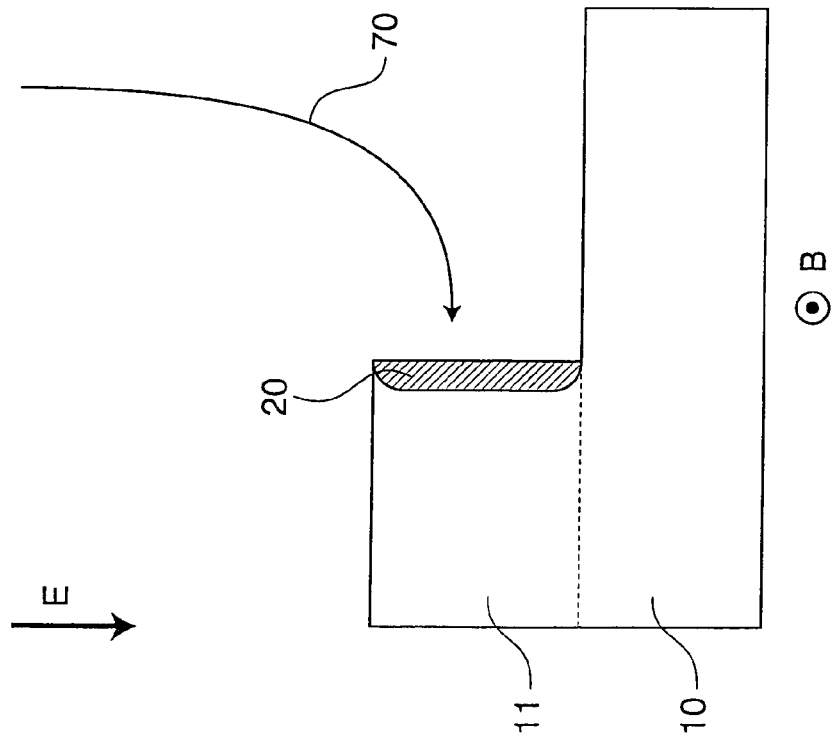
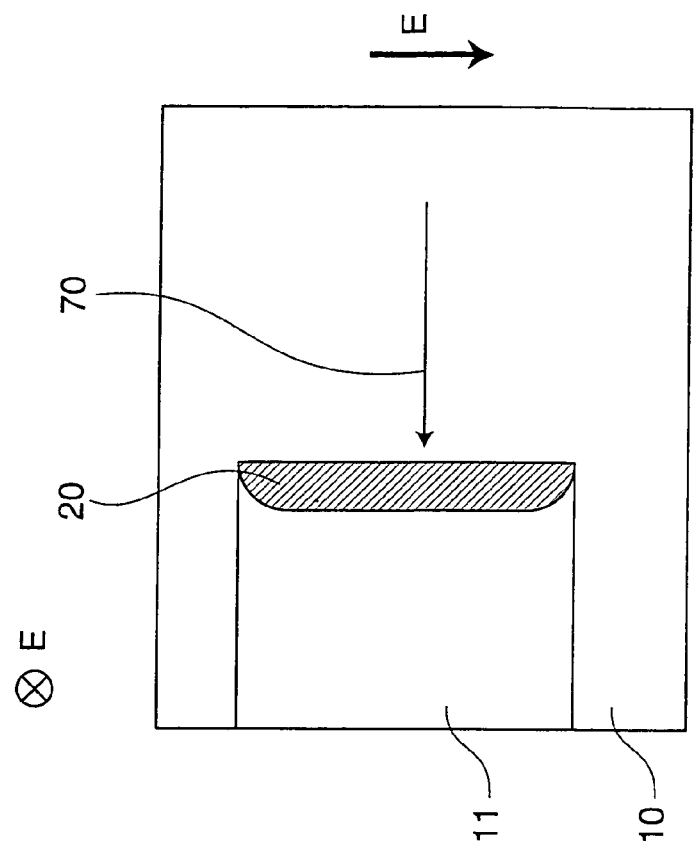
FIG.1(a)
FIG.1(b)

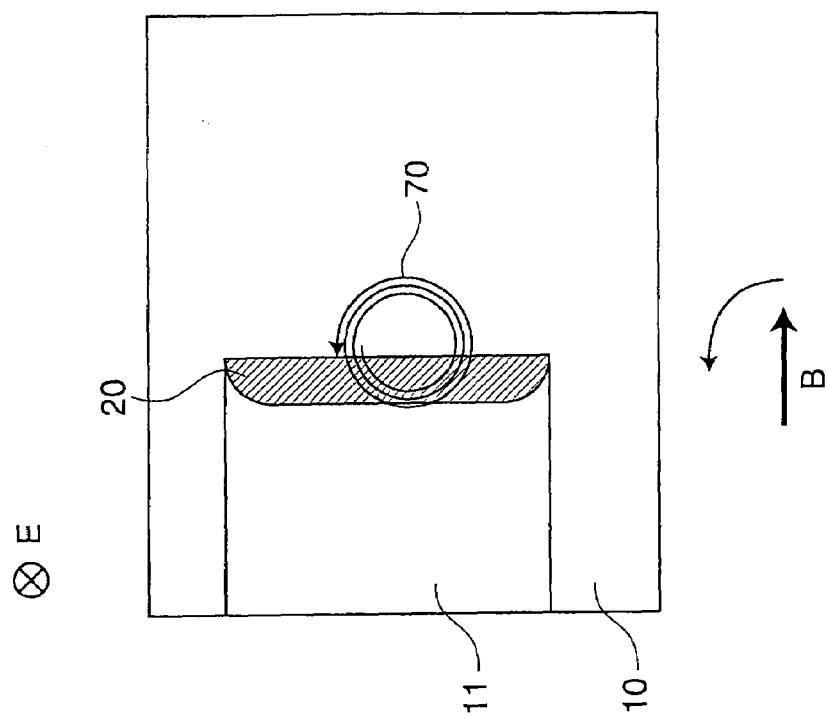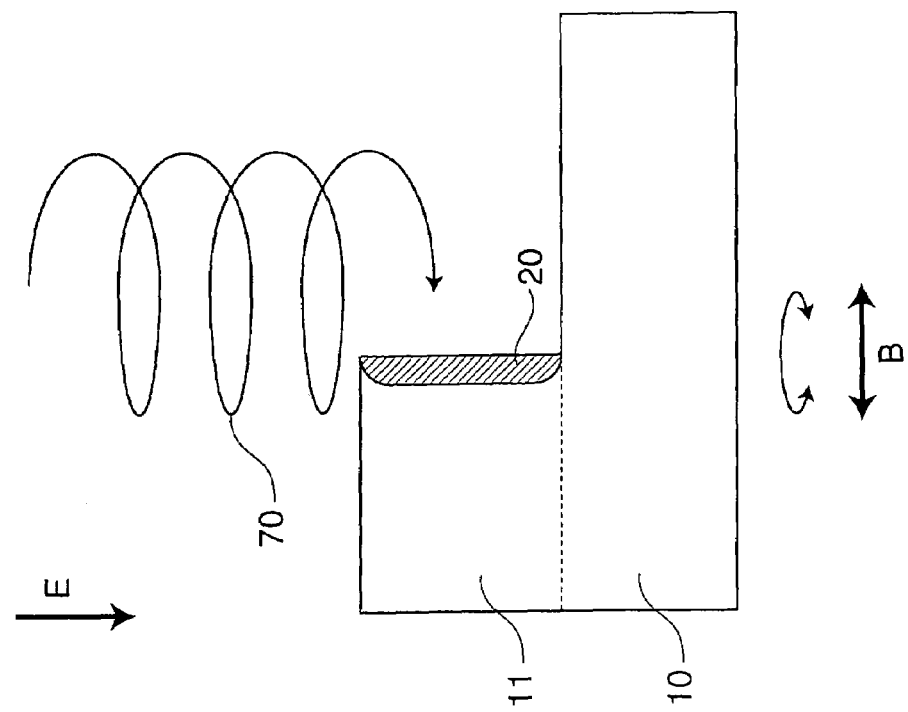

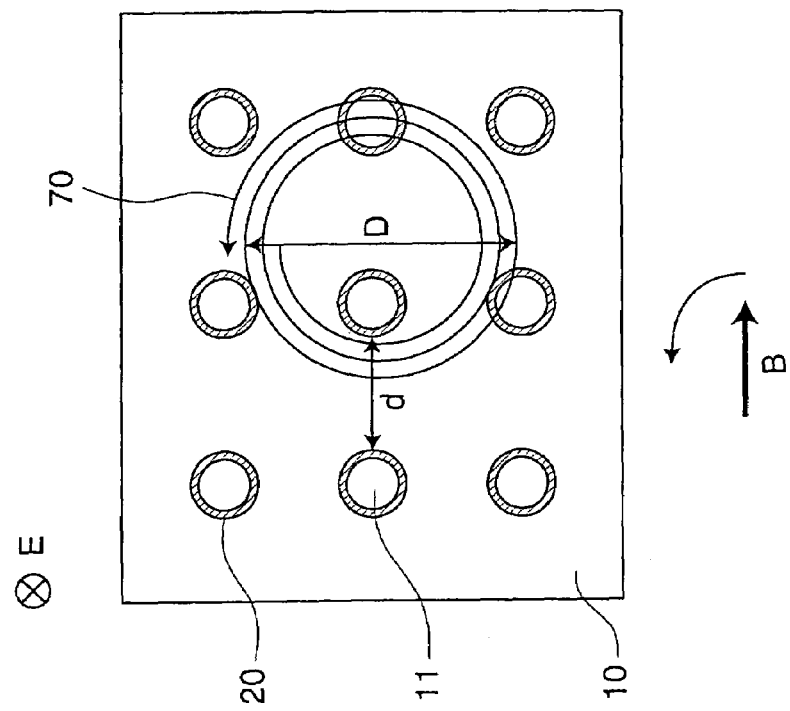
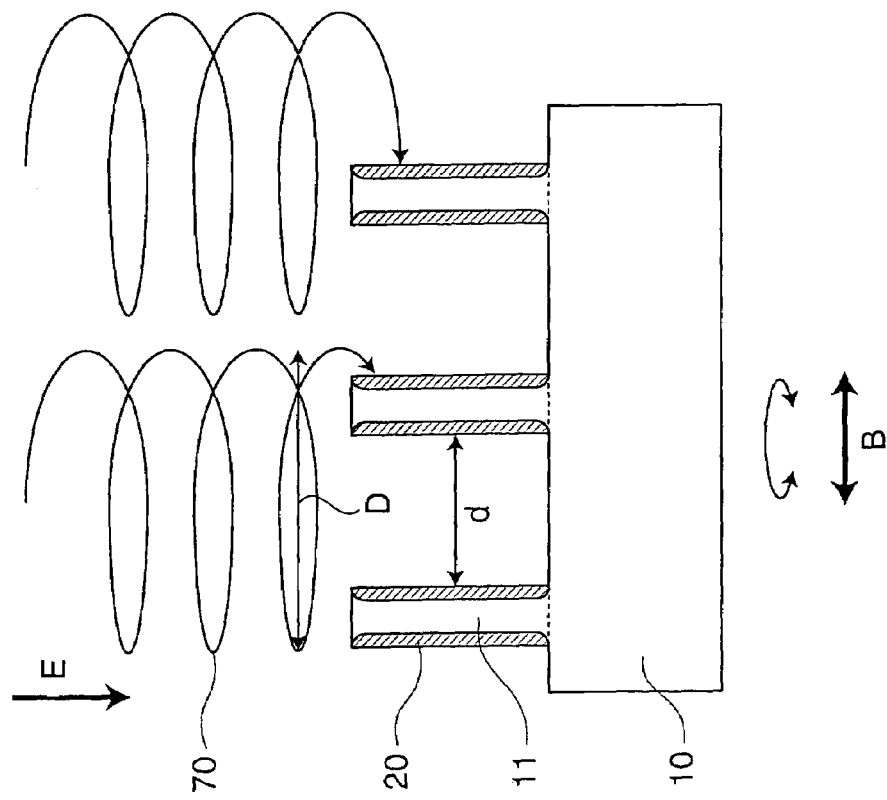
FIG.3(b)
FIG.3(a)

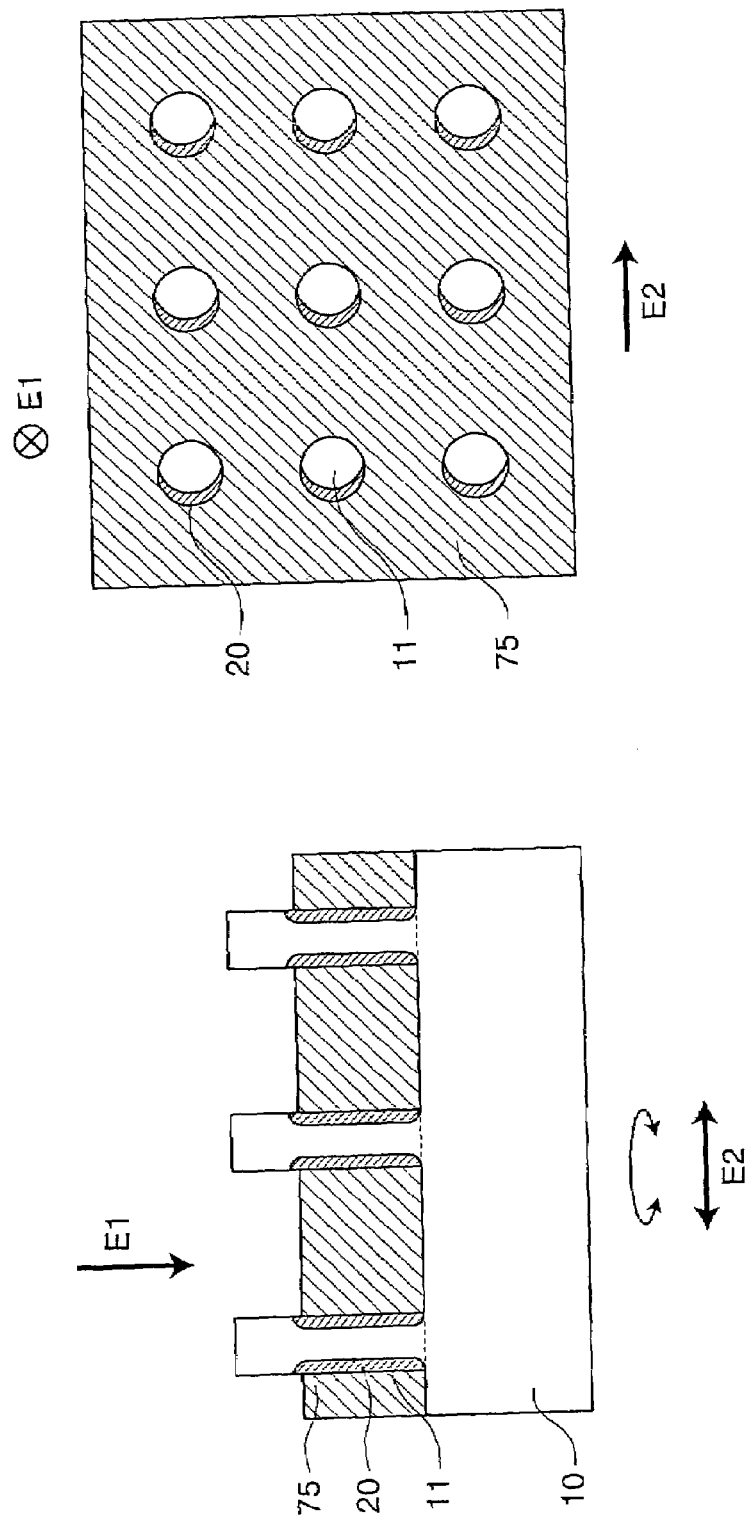

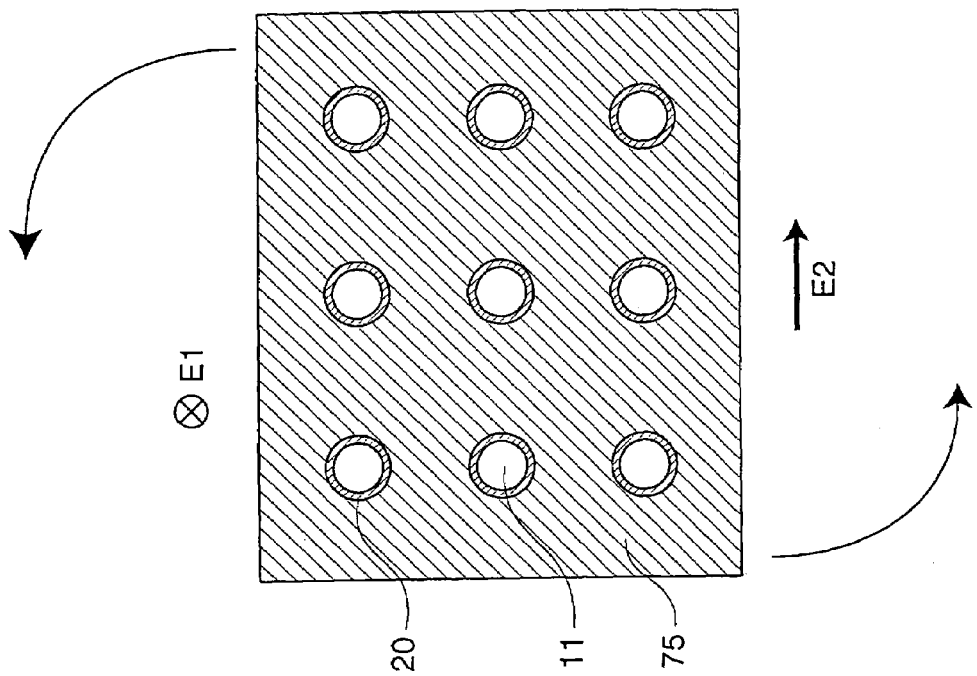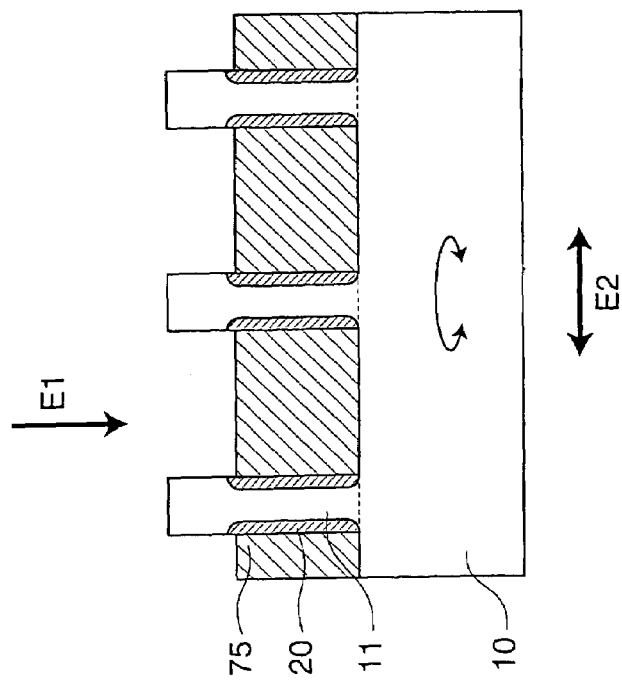

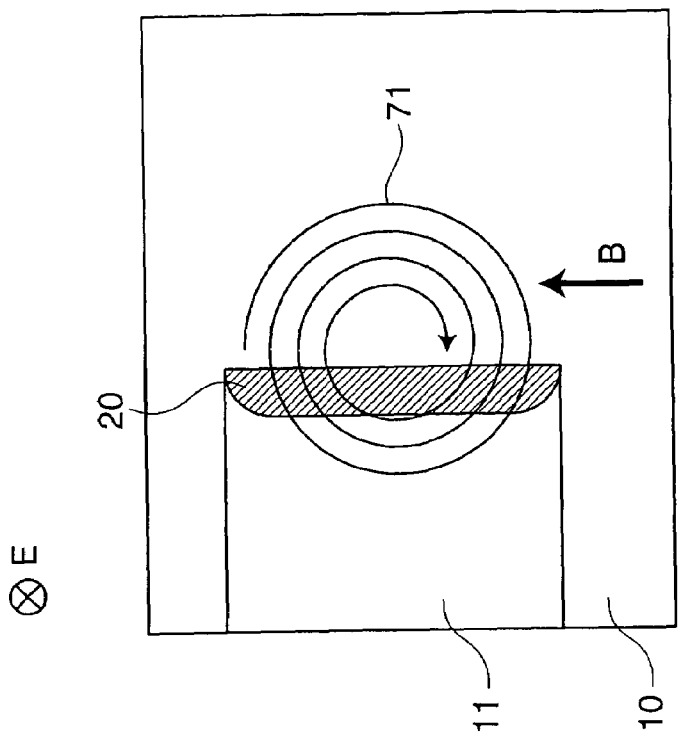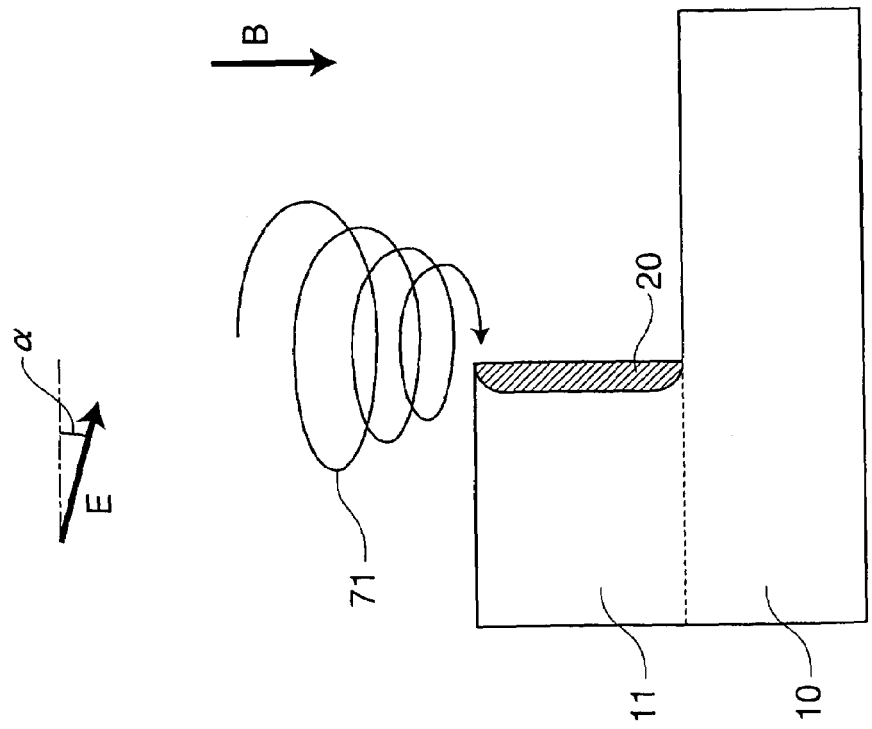

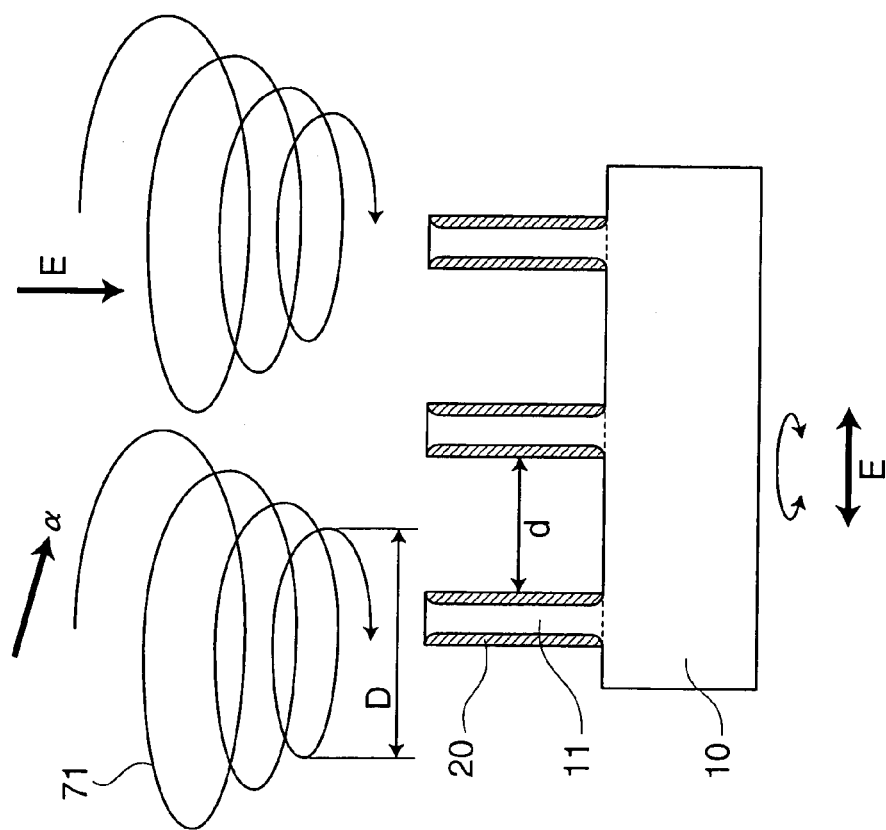
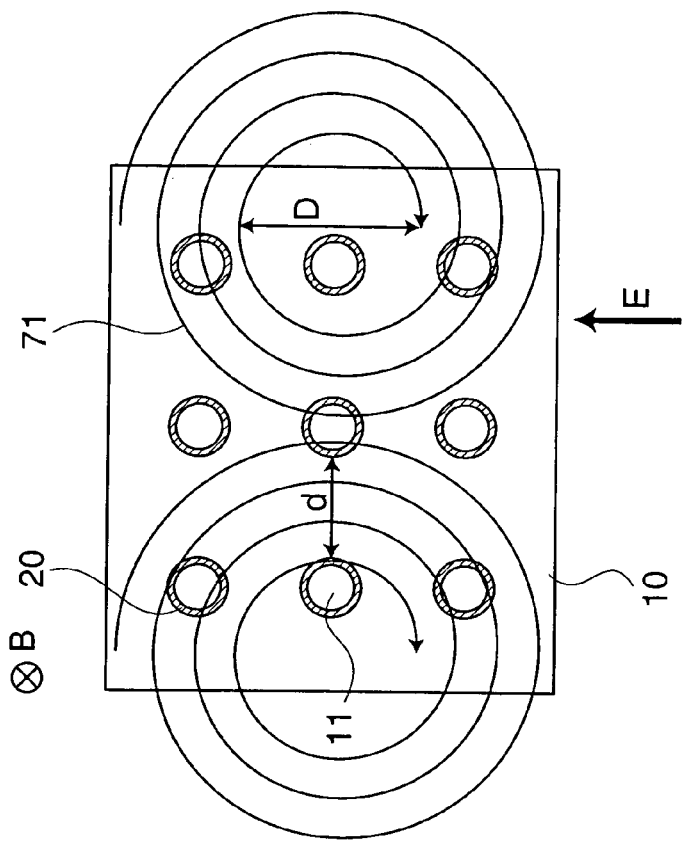
FIG.8(a)
FIG.8(b)

METHOD FOR IMPLANTING IONS INTO SEMICONDUCTOR SUBSTRATE

CROSS-REFERENCE TO RELATED APPLICATION

This application is related to Japanese application No. 2003-207346 filed on Aug. 12, 2003 whose priority is claimed under 35 USC §119, the disclosure of which is incorporated by reference in its entirety.

BACKGROUND OF THE INVENTION

1. Field of the Invention

The present invention relates to a method for implanting ions into a semiconductor substrate and, more particularly, to a method for implanting ions into a side wall of a protruded semiconductor layer on a semiconductor substrate.

2. Description of the Related Art

In a production process for a large-scale semiconductor integrated circuit employing a so-called planar technique, minute semiconductor elements are formed in a plane on a surface of a semiconductor substrate. For the formation of the semiconductor elements, diffusion layers each serving as an N-conductivity region or a P-conductivity region are generally formed in the semiconductor substrate by utilizing an ion implantation technique.

In the ion implantation technique, an impurity to be implanted is ionized, and the resulting ions are accelerated by an electric field and implanted into semiconductor crystals in the semiconductor substrate. The implanted ions collide against atoms and electrons in the semiconductor crystals and scatter in the semiconductor crystals, thereby losing energy to stop after traveling a predetermined distance in the semiconductor crystals. Where the ions are implanted along a line normal to the surface of the semiconductor substrate to selectively form a diffusion layer in a portion of the semiconductor substrate exposed through a mask opening, the implanted ions diffuse depthwise in the semiconductor substrate with a certain ion concentration distribution. The implanted ions also diffuse laterally in the semiconductor substrate with a certain ion concentration distribution. FIG. 9(a) is a sectional view of a P-type semiconductor substrate 10 which has an N-type diffusion layer 20 formed therein, for example, by implanting phosphorus ions into the semiconductor substrate 10 by applying a phosphorus ion beam 70 through an opening provided in a resist 50 formed on the substrate 10 by the ion implantation method. FIG. 9(b) is a characteristic diagram illustrating an impurity concentration distribution (the distribution of the concentration of the implanted phosphorus ions) in a sectional plane A–A' in FIG. 9(a). As shown in FIG. 9(b), the impurity concentration distribution is such that the impurity concentration is the highest at the surface of the semiconductor substrate and decreases depthwise apart from the surface of the substrate. A region of the semiconductor substrate having a higher impurity concentration is the N-type diffusion region. In a semiconductor substrate region deeper than the N-type diffusion region, an intrinsic impurity of the semiconductor substrate is uniformly distributed.

In a so-called oblique ion implantation technique, ions are implanted into a semiconductor substrate at a certain angle θ with respect to a line normal to a surface of the semiconductor substrate for expanding a lateral impurity distribution or for preventing channeling. FIG. 10(a) is a sectional view of a P-type semiconductor substrate 10 which has an N-type diffusion layer 20 formed therein, for example, by implanting phosphorus ions into the semiconductor substrate 10 by applying a phosphorus ion beam 70 at an angle θ with respect to a line normal to a surface of the substrate 10 through an opening provided in a resist 50 formed on the substrate 10. FIG. 10(b) is a characteristic diagram illustrating an impurity concentration distribution (the distribution of the concentration of the implanted phosphorus ions) in a sectional plane B-B' in FIG. 10(a). The depthwise impurity concentration distribution in the plane B–B' is substantially the same as in FIG. 9(b). The oblique ion implantation technique makes it possible to implant the ions not only perpendicularly to the surface of the semiconductor substrate but also parallel to the surface of the semiconductor substrate. FIG. 11 is a sectional view of a P-type semiconductor substrate 10 which has an N-type diffusion layer 20 formed in a surface portion of the substrate and a side wall of a step of the substrate exposed through an opening provided in a resist 50 formed on the substrate 10. The formation of the diffusion layer 20 on the side wall of the step is achieved, for example, by implanting phosphorus ions into the semiconductor substrate 10 by applying a phosphorus ion beam 70 at an angle θ with respect to a line normal to the surface of the semiconductor substrate 10. The oblique ion implantation method is employed, for example, for forming an N-type MOS transistor of a gate overlap LDD structure to minimize an overlap on a source side for microminiaturization of a semiconductor device (see, for example, Japanese Unexamined Patent Publication No. 05-114608 (1993)). Further, the oblique ion implantation method is employed for introducing an impurity into a trench side wall for highly accurately forming a device isolation region in a self-aligning manner (see, for example, Japanese Unexamined Patent Publication No. 2000-183154).

However, it is difficult to implant ions into a portion of the semiconductor substrate perpendicular to the substrate surface by the aforesaid oblique ion implantation. This is because it is difficult to form a mask opening to expose only the portion of the substrate perpendicular to the substrate surface by a photolithography method employed in the so-called planar technique in which circuit elements such as transistors are formed in a plane on the semiconductor substrate.

In recent years, however, there is an increasing need for micro-processing and higher density integration of circuit elements. For example, nonvolatile memories typified by flash EEPROMs have found extensive application as higher-capacity and smaller-size information recording media for computers, communication devices, measurement instruments, automated control devices and personal daily life devices. Hence, there is an increasing demand for less expensive and higher-capacity nonvolatile memory cells. However, the size of such a memory cell is determined by a minimum processing dimension (feature size) which is defined by a resolution limit of the photolithography technique. In order to achieve higher density integration without relying on the improvement of the photolithography technique, a three-dimensional memory cell arrangement technique has been developed. In the three-dimensional memory cell arrangement technique, the number of integrated memory cells is increased by stacking the memory cells perpendicularly to the surface of the semiconductor substrate for the higher density integration.

In order to stack circuit elements such as transistors of the memory cells perpendicularly to the surface of the semiconductor substrate by utilizing the three-dimensional memory cell arrangement technique, there is a demand for an ion implantation technique which permits highly accurate control of ion implantation for implanting ions into a side wall of a semiconductor substrate, i.e., in a direction parallel to the surface of the semiconductor substrate.

SUMMARY OF THE INVENTION

In view of the foregoing, the present invention is directed to an ion implantation technique which permits highly accurate control of ion implantation for implanting ions in a direction parallel to a surface of a semiconductor substrate.

According to the present invention, there is provided a method for implanting ions into a side wall of a protruded semiconductor layer on a semiconductor substrate, which comprises applying an electric field to accelerate the ions in one direction and applying a magnetic field parallel to a plane extending at a predetermined angle with respect to the one direction, thereby controlling a direction of the ion implantation to the side wall.

Accelerating the ions in the one direction means that the ions are put in the electric field applied toward the surface of the semiconductor substrate thereby to be accelerated by Coulomb force acting on the ions and projected toward the semiconductor substrate. When the projected ions pass through the magnetic field applied parallel to the plane extending at the predetermined angle, Lorentz force acts on the ions, whereby the ions are imparted with kinetic energy acting laterally of the direction of the ion projection. As a result, the ions travel along a curved trajectory thereby to be implanted into the side wall of the protruded semiconductor layer.

According to the present invention, the ions accelerated in the one direction by the application of the electric field are subjected to the magnetic field applied parallel to the plane extending at the predetermined angle with respect to the one direction. Therefore, the direction of the ion implantation to the side wall of the semiconductor substrate can be controlled with high accuracy.

BRIEF DESCRIPTION OF THE DRAWINGS

FIGS. 1(a) and 1(b) are explanatory diagrams illustrating an ion implantation method according to a first embodiment of the present invention;

FIGS. 2(a) and 2(b) are explanatory diagrams illustrating an ion implantation method according to a second embodiment of the present invention;

FIGS. 3(a) and 3(b) are explanatory diagrams illustrating an ion implantation method according to a third embodiment of the present invention;

FIGS. 4(a) and 4(b) are explanatory diagrams illustrating an ion implantation method according to a fourth embodiment of the present invention;

FIGS. 6(a) and 6(b) are explanatory diagrams illustrating a case where a substrate is rotated in the ion implantation method according to the fifth embodiment of the present invention;

FIGS. 7(a) and 7(b) are explanatory diagrams illustrating an ion implantation method according to a sixth embodiment of the present invention;

FIGS. 8(a) and 8(b) are explanatory diagrams illustrating an ion implantation method according to a seventh embodiment of the present invention;

DETAILED DESCRIPTION OF THE INVENTION

Figure 5B:
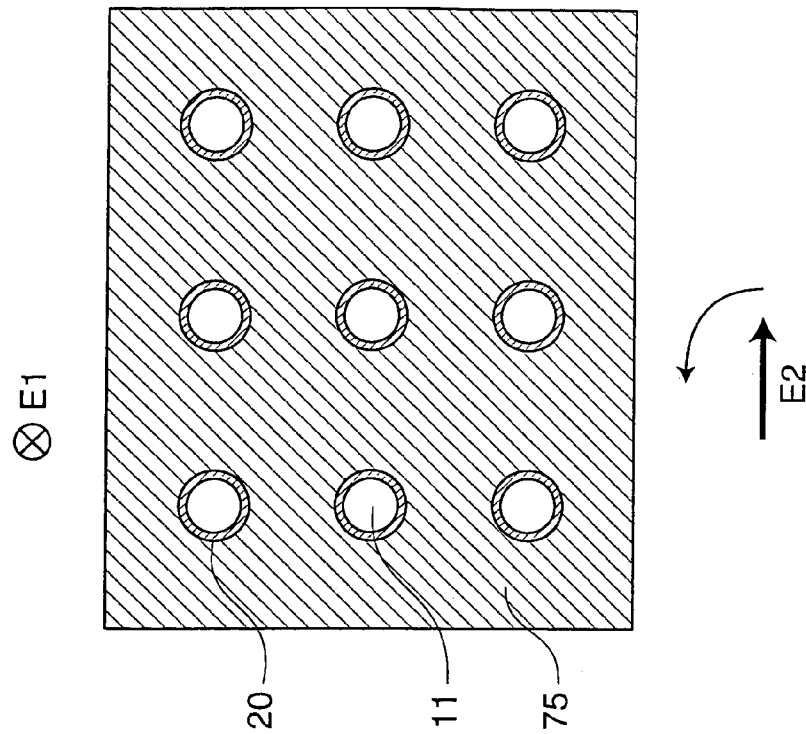
FIGS. 5(a) and 5(b) are explanatory diagrams illustrating a case where a magnetic field is rotated in an ion implantation method according to a fifth embodiment of the present invention.

The present invention relates to a method for implanting ions into a side wall of a protruded semiconductor layer on a semiconductor substrate. According to the present invention, a conventionally known semiconductor material such as silicon may be employed as a material for the semiconductor substrate. A step is formed on a surface of the semiconductor substrate by a known method commonly employed in a three-dimensional memory cell arrangement technique.

A known ion implantation apparatus for production of a semiconductor device, for example, may be employed as an apparatus for the ion implantation. In the known ion implantation apparatus, an ion beam is generated and projected by accelerating the ions put in the electric field. In one embodiment of the present invention, the ions are projected at a predetermined tilt angle with respect to the surface of the semiconductor substrate. In another embodiment of the present invention, the ions are projected perpendicularly to the surface of the semiconductor substrate as in the conventional semiconductor production method.

An inventive ion implantation method for implanting ions into a side wall of a semiconductor layer comprises applying an electric field to accelerate the ions in one direction and applying a magnetic field parallel to a plane extending at a predetermined angle with respect to the one direction. The magnetic field may be rotated parallel to the plane extending at the predetermined angle with respect to the electric field application direction, so that the ions travel spirally in the electric field application direction. Thus, the ions traveling spirally in the electric field application direction are implanted into the side wall of the step not only in the one direction but also in all the other directions.

The electric field may be applied perpendicularly to a surface of the semiconductor substrate, and the magnetic field may be applied parallel to the surface of the semiconductor substrate.

The protruded semiconductor layer may include a plurality of projection columns, and the magnetic field may be applied so that the ions travel spirally with a diameter greater than a distance between each two adjacent projection columns. Thus, the ions traveling spirally with the diameter greater than the distance between the adjacent projection columns are implanted into the side wall of the step at a higher probability. Therefore, the ion implantation to the side wall of the step can more effectively be achieved.

Another inventive ion implantation method for implanting ions into a side wall of a protruded semiconductor layer on a semiconductor substrate, which comprises: forming an implantation ion atmosphere on the vicinity of the protruded semiconductor layer on the semiconductor substrate; and applying an electric field parallel to a plane extending in parallel or at a predetermined angle with respect to a surface of the semiconductor substrate to accelerate the ions for the ion implantation to the side wall of the semiconductor layer. Thus, the implantation ion atmosphere is formed, and then the ions are accelerated by the electric field and implanted into the side wall. Therefore, the ion implantation to the side wall can be controlled with high accuracy.

The electric field may be rotated parallel to the surface of the semiconductor substrate. Thus, the ions are caused to travel spirally by the rotation of the electric field for the ion implantation. Therefore, the ions can be implanted into the side wall of the step not only in one direction but also in all the other directions.

The protruded semiconductor layer may include a plurality of projection columns.

The formation of the implantation ion atmosphere may be provided by applying an electric field perpendicular to the substrate surface so that the ions are transported to the vicinity of the protruded semiconductor layer.

DESCRIPTION OF THE PREFERRED EMBODIMENTS

With reference to the attached drawings, the present invention will hereinafter be described in detail by way of embodiments thereof. However, it should be understood that the invention be not limited to these embodiments.

First Embodiment

FIG. 1(a) is a sectional view of a semiconductor substrate for explaining an ion implantation method according to this embodiment, and FIG. 1(b) is a plan view of the semiconductor substrate as seen in the direction of projection of ions.

As shown in FIGS. 1(a) and 1(b), a P-type silicon semiconductor substrate 10 has a semiconductor layer 11 provided on a surface thereof. An ion beam 70 projected toward the surface of the substrate 10 perpendicularly to the substrate surface is accelerated by an electric field E applied in the same direction as the ion beam projecting direction thereby to reach the substrate 10. The ion beam 70 passes through a magnetic field B applied parallel to the surface of the substrate 10. At this time, Lorentz force acts on the ion beam 70, so that the ion beam 70 is imparted with kinetic energy parallel to the silicon substrate surface. As a result, the ion beam 70 travels along a curved trajectory to reach the substrate 10, whereby the ions are implanted into a side wall of the semiconductor layer 11 provided on the surface of the substrate 10, i.e., into a side wall of a step of the semiconductor layer 11. Thus, an N-type diffusion layer 20 is formed in the side wall of the step.

The ions to be implanted are preferably phosphorus ions. The dose of the ions to be implanted (the number of ions to be implanted per unit area) is preferably $1 \times 10^{10}$ cm$^{-2}$ to $1 \times 10^{16}$ cm$^{-2}$, and the kinetic energy to be imparted to the ions by the application of the electric field E is preferably 1 keV to 5 MeV. The magnetic flux density of the magnetic field B to be applied is preferably 1 μT to 100 T. However, the dose, the kinetic energy and the magnetic flux density are not limited to the aforesaid ranges.

In this embodiment, the N-type diffusion layer is formed in the P-type semiconductor substrate, but a P-type diffusion layer may be formed in an N-type semiconductor substrate in the aforesaid manner. For the formation of the N-type diffusion layer in the silicon substrate, arsenic ions or the like may be used instead of the phosphorus ions. For the formation of the P-type diffusion layer in the silicon substrate, boron ions or the like may be used. The type of the ions to be implanted is not particularly limited, as long as a desired diffusion layer can be provided. The material for the semiconductor substrate is not limited to silicon. Other exemplary materials for the semiconductor substrate include a germanium semiconductor, a gallium-arsenic semiconductor and an indium-phosphorus semiconductor.

When the ions are implanted into the side wall of the step, it is desirable that the ions do not impinge on the surface of the substrate 10 or a surface of the semiconductor layer 11 parallel to the substrate surface. For prevention of the ion implantation to the substrate surface or the semiconductor layer surface parallel to the substrate surface, a hard mask such as a silicon oxide film or a silicon nitride film is formed on the surface to be prevented from the ion implantation. However, where the impingement of the ions on the substrate surface or the semiconductor layer surface parallel to the substrate surface causes no adverse effect, there is no need to take the aforesaid measures.

The magnetic field B is preferably applied parallel to the surface of the substrate 10 as described above, but the direction of the application of the magnetic field B is not necessarily required to be parallel to the substrate surface as long as the ions can be implanted into the side wall of the step. FIGS. 1(a) and 1(b) illustrate the case where the ions to be implanted have a positive polarity. Where the ions to be implanted have a negative polarity, the magnetic field B is applied in a direction opposite from that shown in FIG. 1(b).

Second Embodiment

In this embodiment, a magnetic field B applied parallel to a surface of a P-type silicon semiconductor substrate 10 is rotated in a plane parallel to the substrate surface. Thus, an ion beam 70 travels spirally with respect to the substrate surface to reach the substrate surface. FIG. 2(a) is a sectional view of the semiconductor substrate for explaining an ion implantation method according to this embodiment, and FIG. 2(b) is a plan view of the semiconductor substrate as seen in the direction of projection of ions.

As shown in FIGS. 2(a) and 2(b), the ion beam 70 is projected toward the surface of the P-type silicon semiconductor substrate 10 perpendicularly to the substrate surface, and accelerated by an electric field E applied in the same direction as the ion beam projecting direction thereby to reach the substrate 10. The ion beam 70 passes through the rotating magnetic field B applied parallel to the surface of the substrate 10. At this time, Lorentz force acts on the ion beam 70, so that the ion beam 70 is imparted with kinetic energy parallel to the silicon substrate surface. As a result, the ion beam 70 travels spirally to reach the surface of the substrate 10, whereby the ions are implanted into a side wall of a semiconductor layer 11 provided on the surface of the substrate 10, i.e., into a side wall of a step of the semiconductor layer 11. Thus, an N-type diffusion layer 20 is formed in the side wall of the step.

The ions to be implanted are preferably phosphorus ions or arsenic ions. The dose of the ions to be implanted is preferably $1 \times 10^{11}$ cm$^{-2}$ to $1 \times 10^{16}$ cm$^{-2}$, and the kinetic energy to be imparted to the ions by the application of the electric field E is preferably 1 keV to 5 MeV. The magnetic flux density of the magnetic field B to be applied is preferably 1 μT to 100 T. The rotation speed of the magnetic field B is preferably 1 rpm to 1000 rpm. However, the dose, the kinetic energy, the magnetic flux density and the rotation speed are not limited to the aforesaid ranges.

In this embodiment, the N-type diffusion layer is formed in the P-type semiconductor substrate, but a P-type diffusion layer may be formed in an N-type semiconductor substrate in the aforesaid manner. For the formation of the N-type diffusion layer in the silicon substrate, phosphorus ions or arsenic ions may be used. For the formation of the P-type diffusion layer in the silicon substrate, boron ions or the like may be used. The type of the ions to be implanted is not particularly limited, as long as a desired diffusion layer can be provided. The material for the semiconductor substrate is not limited to silicon. Other exemplary materials for the semiconductor substrate include a germanium semiconductor, a gallium-arsenic semiconductor and an indium-phosphorus semiconductor.

When the ions are implanted into the side wall of the step, it is desirable that the ions do not impinge on the surface of the substrate 10 or a surface of the semiconductor layer 11 parallel to the substrate surface. For prevention of the ion implantation to the substrate surface or the semiconductor layer surface parallel to the substrate surface, a hard mask such as a silicon oxide film or a silicon nitride film is formed on the surface to be prevented from the ion implantation. However, where the impingement of the ions on the substrate surface or the semiconductor layer surface parallel to the substrate surface causes no adverse effect, there is no need to take the aforesaid measures.

The magnetic field B is preferably applied parallel to the surface of the substrate 10 as described above, but the direction of the application of the magnetic field B is not necessarily required to be parallel to the substrate surface as long as the ions can be implanted into the side wall of the step.

In this embodiment, the magnetic field B applied parallel to the surface of the substrate 10 is rotated. Alternatively, the substrate 10 but not the magnetic field B may be rotated. The magnetic field B or the substrate 10 may be rotated either clockwise or counterclockwise. FIGS. 2($a$) and 2($b$) illustrate the case where the ions to be implanted have a positive polarity. However, this embodiment is also applicable to a case where the ions to be implanted have a negative polarity.

Third Embodiment

FIGS. 3($a$) and 3($b$) illustrate a case where a semiconductor layer 11 provided on a surface of a P-type silicon semiconductor substrate 10 of a semiconductor device is shaped in a plurality of projection columns thereby to have a plurality of steps. FIG. 3($a$) is a sectional view of the semiconductor substrate for explaining an ion implantation method according to this embodiment, and FIG. 3($b$) is a plan view of the semiconductor substrate as seen in the direction of projection of ions.

In this embodiment, a magnetic field B is applied so that an ion beam 70 travels spirally with a diameter D greater than a distance d between each two adjacent projection columns as shown in FIG. 7. If the magnetic field B is controlled so that the diameter D and the distance d satisfy a relationship d<D, ions of the ion beam 70 reaching the surface of the substrate 10 are implanted into side walls of the projection columns of the semiconductor layer 11 at a higher probability. Therefore, the ion implantation to the side walls of the projection columns can effectively be achieved.

The distance d between the adjacent projection columns of the semiconductor layer 11 and the diameter D of the spiral motion are preferably about 1 nm to about 10 μm, but are not limited to this range.

In the plan views of FIGS. 2($b$) and 3($b$), the diameter D of the spiral motion of the ions increases toward the substrate 10, but may decrease toward the substrate 10 or may be unchanged. The change in the diameter D of the spiral motion of the ions before the ions reach the silicon substrate after the projection of the ions is not particularly limited, as long as the ion implantation can be achieved as desired. FIGS. 3($a$) and 3($b$) illustrate the case where the ions to be implanted have a positive polarity. However, this embodiment is also applicable to a case where the ions to be implanted have a negative polarity.

Fourth Embodiment

FIG. 4($a$) is a sectional view of a semiconductor substrate for explaining an ion implantation method according to this embodiment. As shown in FIG. 4($a$), a P-type silicon semiconductor substrate 10 has a semiconductor layer 11 provided on a surface thereof and shaped in a plurality of projection columns. FIG. 4($b$) is a plan view of the semiconductor substrate as seen from a side of the semiconductor substrate formed with the semiconductor layer 11.

In this embodiment, an electric field E1 is applied perpendicularly to the surface of the substrate 10 so as to cause ions to travel to the vicinity of the surface of the substrate 10 for ion transportation. Thus, an implantation ion atmosphere 75 is formed in the vicinity of the substrate surface. Thereafter, an electric field E2 is applied parallel to the substrate surface. Thus, ions in the implantation ion atmosphere 75 are accelerated parallel to the substrate surface. As a result, the ions are implanted into side walls of the projection columns of the semiconductor layer 11, whereby N-type diffusion layers 20 are formed in the side walls of the projection columns.

The electric field E2 parallel to the substrate surface is first applied for a predetermined period t1, and the application of the electric field E2 is once stopped. Then, the electric field E1 perpendicular to the substrate surface is applied to transport the ions to the vicinity of the substrate surface. Alternatively, the transportation of the ions to the vicinity of the silicon substrate surface may be achieved by applying the electric field E1 while applying the electric field E2.

The ions to be implanted are preferably phosphorus ions. The dose of the ions to be implanted (the number of the ions to be implanted per unit area) is preferably $1\times10^{10}$ cm$^{-2}$ to $1\times10^{18}$ cm$^{-2}$. A kinetic energy to be imparted to the ions by the application of the electric field E1 to transport the ions to the vicinity of the substrate surface is preferably 1 keV to 5 keV. A kinetic energy to be imparted to the ions by the application of the electric field E2 parallel to the substrate surface is preferably 1 kV to 10 MV. However, the dose and the kinetic energies are not limited to the aforesaid ranges.

In this embodiment, the N-type diffusion layer is formed in the P-type semiconductor substrate, but a P-type diffusion layer may be formed in an N-type semiconductor substrate in the aforesaid manner. For the formation of the N-type diffusion layer in the silicon substrate, arsenic ions or the like may be used instead of the phosphorus ions. For the formation of the P-type diffusion layer in the silicon substrate, boron ions or the like may be used. The type of the ions to be implanted is not particularly limited, as long as a desired diffusion layer can be provided. The material for the semiconductor substrate is not limited to silicon. Other exemplary materials for the semiconductor substrate include a germanium semiconductor, a gallium-arsenic semiconductor and an indium-phosphorus semiconductor.

The electric field E2 is desirably applied parallel to the surface of the substrate 10 as described above, but the direction of the application of the electric field E2 is not necessarily required to be parallel to the substrate surface as long as the ions can be implanted into the side walls of the steps.

Fifth Embodiment

Figure 5A:
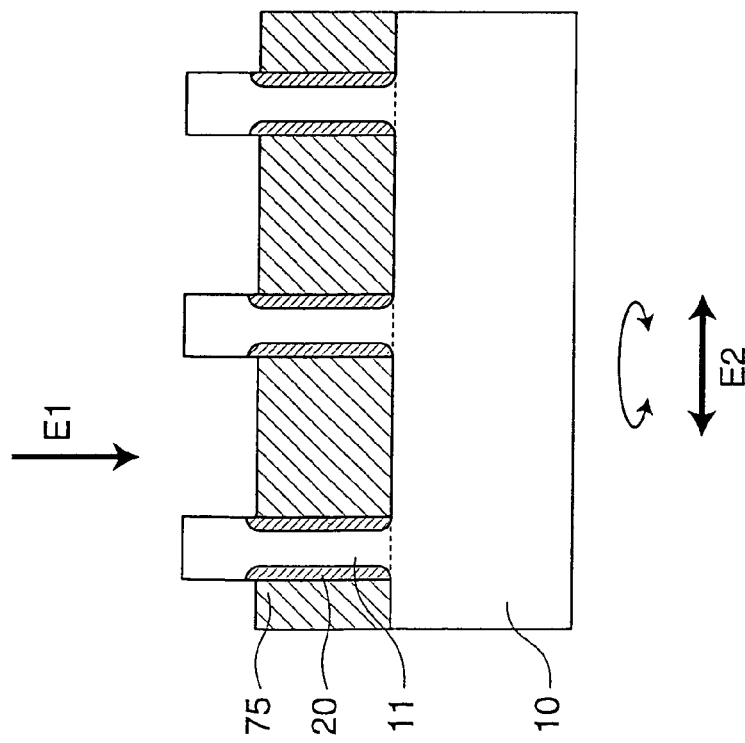
Figure 9A:
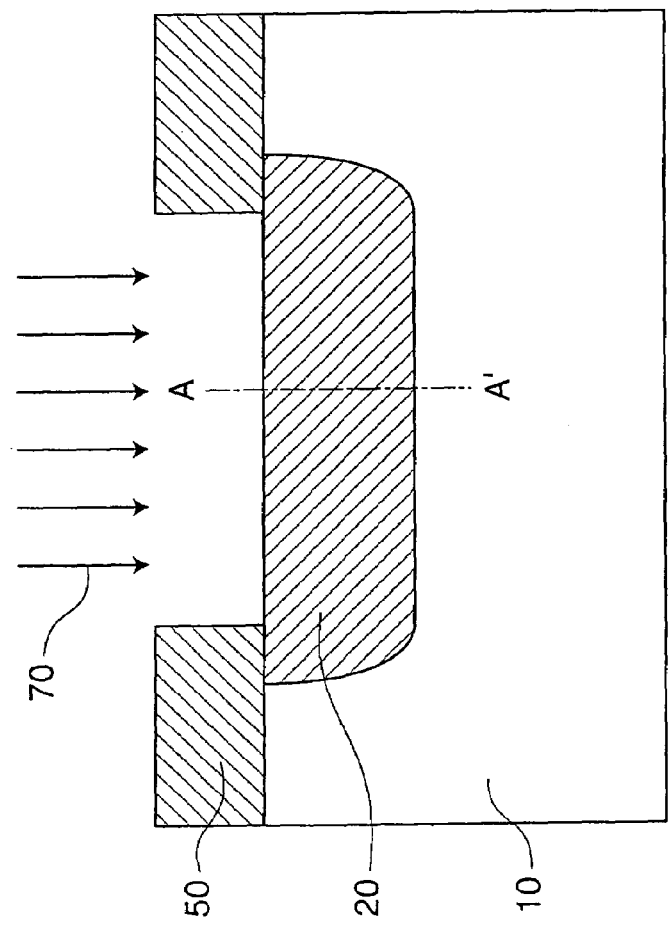
FIGS. 9(a) and 9(b) are diagrams for explaining formation of an N-type diffusion layer in a substrate surface by a conventional ion implantation method.
Figure 9B:
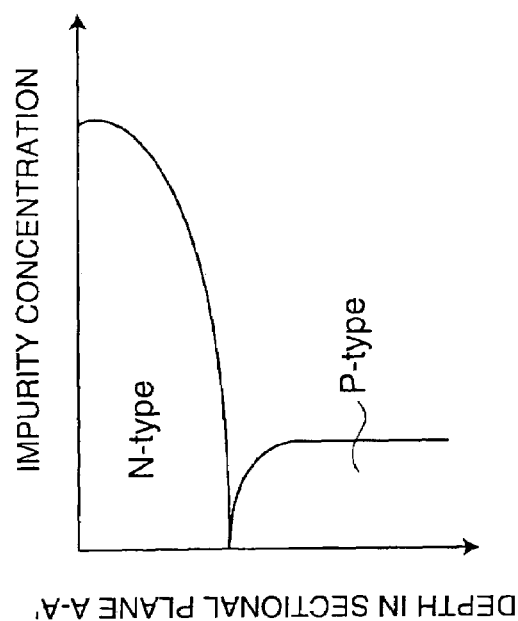
Figure 10B:
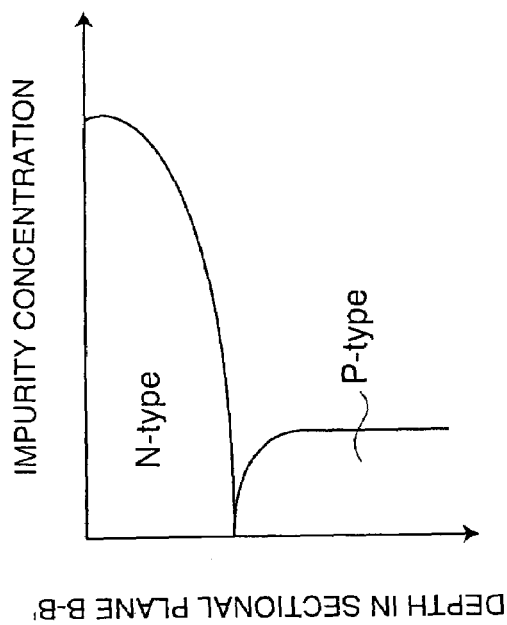
FIGS. 10(a) and 10(b) are diagrams for explaining formation of an N-type diffusion layer in a substrate surface by a conventional oblique ion implantation method.
Figure 10A:
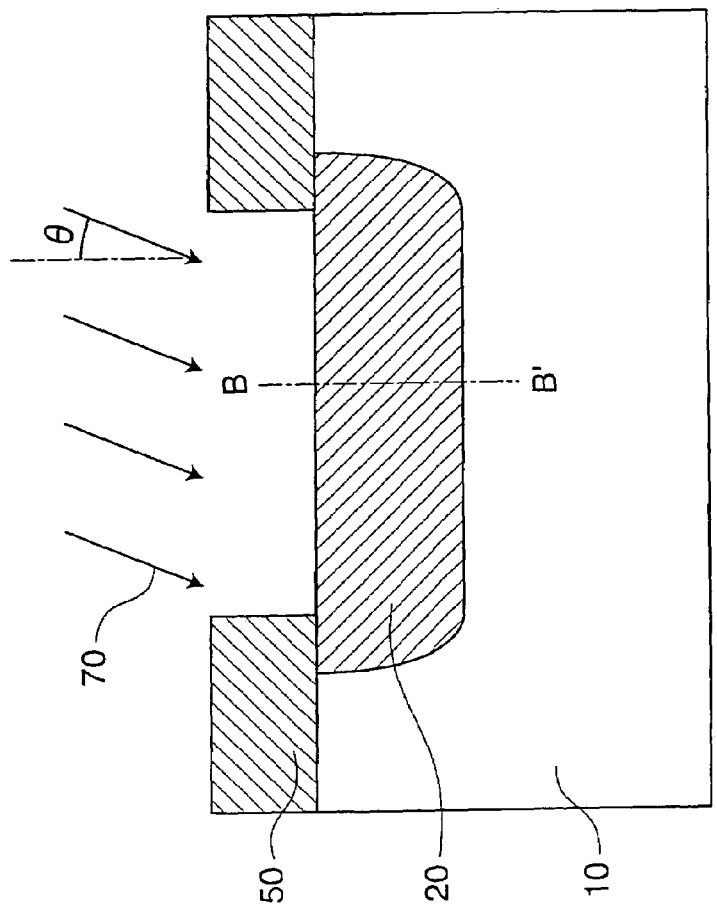
Figure 11:
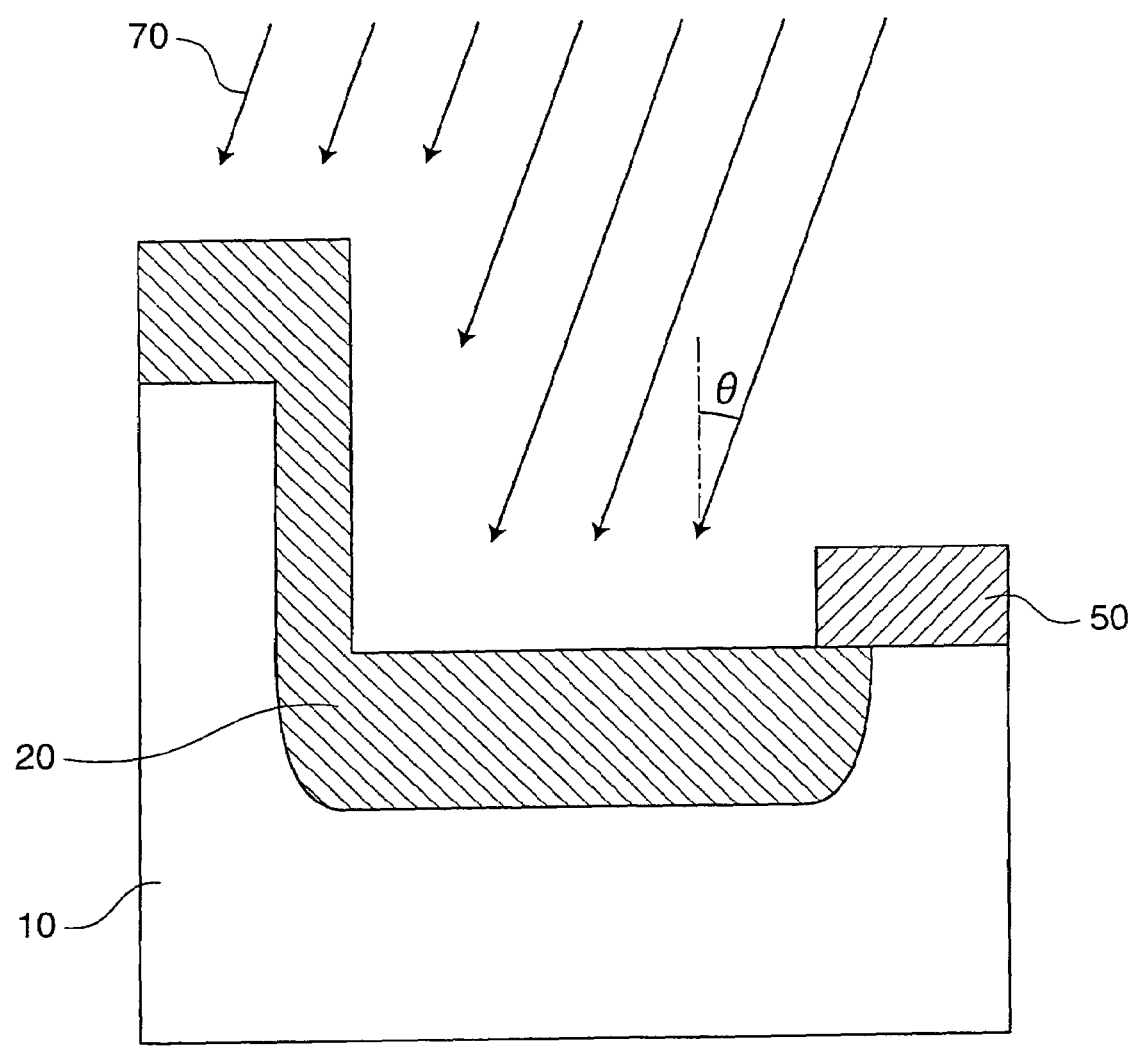
FIG. 11 is a diagram for explaining formation of an N-type diffusion layer in a side wall of a step by the conventional oblique ion implantation method.

In this embodiment, an electric field E2 applied parallel to a surface of a P-type silicon semiconductor substrate 10 is rotated in a plane parallel to the substrate surface. Thus, ions travel spirally with respect to the substrate surface to reach side walls of projection columns of a semiconductor layer 11 provided on the surface of the substrate 10. FIG. 5($a$) is a sectional view of the semiconductor substrate for explaining an ion implantation method according to this embodiment, and FIG. 5($b$) is a plan view of the semiconductor substrate as seen from a side of the semiconductor substrate formed with the semiconductor layer 11.

In this embodiment, an electric field E1 is applied perpendicularly to the surface of the substrate 10 so as to cause the ions to travel to the vicinity of the substrate surface for ion transportation. Thus, an implantation ion atmosphere 75 is formed in the vicinity of the substrate surface. Thereafter, the electric field E2 is applied while being rotated in a plane parallel to the substrate surface. Thus, the ions in the implantation ion atmosphere 75 are accelerated parallel to the substrate surface. As a result, the ions are implanted into the entire side walls of the projection columns of the semiconductor layer 11, whereby N-type diffusion layers 20 are formed in the side walls of the projection columns.

The electric field E2 parallel to the substrate surface is first applied for a predetermined period t1, and the application of the electric field E2 is once stopped. Then, the electric field E1 perpendicular to the substrate surface is applied to transport the ions to the vicinity of the substrate surface. Alternatively, the transportation of the ions to the vicinity of the silicon substrate surface may be achieved by applying the electric field E1 while applying the electric field E2.

The ions to be implanted are preferably phosphorus ions. The dose of the ions to be implanted (the number of the ions to be implanted per unit area) is preferably $1 \times 10^1$ cm$^{-2}$ to $1 \times 10^{18}$ cm$^{-2}$. A kinetic energy to be imparted to the ions by the application of the electric field E1 to transport the ions to the vicinity of the substrate surface is preferably 1 keV to 5 keV. A kinetic energy to be imparted to the ions by the application of the electric field E2 parallel to the substrate surface is preferably 1 kV to 10 MV. The rotation speed of the electric field E2 is preferably 1 rpm to 1000 rpm. However, the dose, the kinetic energies and the rotation speed are not limited to the aforesaid ranges.

In this embodiment, the N-type diffusion layer is formed in the P-type semiconductor substrate, but a P-type diffusion layer may be formed in an N-type semiconductor substrate in the aforesaid manner. For the formation of the N-type diffusion layer in the silicon substrate, arsenic ions or the like may be used instead of the phosphorus ions. For the formation of the P-type diffusion layer in the silicon substrate, boron ions or the like may be used. The type of the ions to be implanted is not particularly limited, as long as a desired diffusion layer can be provided. The material for the semiconductor substrate is not limited to silicon. Other exemplary materials for the semiconductor substrate include a germanium semiconductor, a gallium-arsenic semiconductor and an indium-phosphorus semiconductor.

The electric field E2 is desirably applied parallel to the surface of the substrate 10 as described above, but the direction of the application of the electric field E2 is not necessarily required to be parallel to the substrate surface as long as the ions can be implanted into the side walls of the steps.

In this embodiment, the electric field E2 applied parallel to the surface of the substrate 10 is rotated. In a modification of this embodiment, the substrate 10 but not the electric field E2 may be rotated as shown in FIG. 6($a$) which is a sectional view of the semiconductor substrate subjected to ion implantation according to the modification of the embodiment and FIG. 6($b$) which is a plan view of the semiconductor substrate as seen from a side of the semiconductor substrate formed with the semiconductor layer 11. The electric field E2 or the substrate 10 may be rotated either clockwise or counterclockwise.

Sixth Embodiment

FIG. 7($a$) is a sectional view of a semiconductor substrate for explaining an ion implantation method according to this embodiment, and FIG. 7($b$) is a plan view of the semiconductor substrate as seen from a side of the semiconductor substrate formed with a semiconductor layer.

As shown in FIGS. 7($a$) and 7($b$), an ion beam 71 is projected at a predetermined tilt angle α with respect to a surface of a P-type silicon semiconductor substrate 10. A magnetic field B is applied perpendicularly to the surface of the semiconductor substrate 10 from a source of the ion beam 71. The ion beam 71 projected in the magnetic field B is subjected to Lorentz force. The Lorentz force acting on the ion beam 71 is directed parallel to the substrate surface perpendicularly to the trajectory of the ion beam 71. Therefore, the ion beam 71 travels spirally to reach the substrate surface, whereby ions in the ion beam 71 are implanted into a side wall of a semiconductor layer 11 provided on the surface of the substrate 10, i.e., in a side wall of a step of the semiconductor layer 11. Thus, an N-type diffusion layer 20 is formed in the side wall of the step.

The ions to be implanted are preferably phosphorus ions or arsenic ions. A kinetic energy to be imparted to the ions at the projection of the ion beam 71 is preferably 1 keV to 5 MeV, and the dose of the ions to be implanted is preferably $1 \times 10^1$ cm$^{-2}$ to $1 \times 10^{16}$ cm$^{-2}$. The magnetic flux density of the magnetic field B to be applied is preferably 1 μT to 100 T. However, the kinetic energy, the dose and the magnetic flux density are not limited to the aforesaid ranges.

In this embodiment, the N-type diffusion layer is formed in the P-type semiconductor substrate, but a P-type diffusion layer may be formed in an N-type semiconductor substrate in the aforesaid manner. For the formation of the N-type diffusion layer in the silicon substrate, phosphorus ions or arsenic ions may be used. For the formation of the P-type diffusion layer in the silicon substrate, boron ions or the like may be used. The type of the ions to be implanted is not particularly limited, as long as a desired diffusion layer can be provided. The material for the semiconductor substrate is not limited to silicon. Other exemplary materials for the semiconductor substrate include a germanium semiconductor, a gallium-arsenic semiconductor and an indium-phosphorus semiconductor.

When the ions are implanted into the side wall of the step, it is desirable that the ions do not impinge on the surface of the substrate 10 or a surface of the semiconductor layer 11 parallel to the substrate surface. For prevention of the ion implantation to the substrate surface or the semiconductor layer surface parallel to the substrate surface, a hard mask such as a silicon oxide film or a silicon nitride film is formed on the surface to be prevented from the ion implantation. However, where the impingement of the ions on the substrate surface or the semiconductor layer surface parallel to the substrate surface causes no adverse effect, there is no need to take the aforesaid measures.

The magnetic field B is preferably applied perpendicularly to the surface of the substrate 10 as described above, but the direction of the application of the magnetic field B is not necessarily required to be perpendicular to the substrate surface as long as the ions can be implanted into the side wall of the step. FIGS. 7(a) and 7(b) illustrate the case where the ions to be implanted have a positive polarity. However, this embodiment is also applicable to a case where the ions to be implanted have a negative polarity.

Seventh Embodiment

FIGS. 8(a) and 8(b) illustrate a case where a semiconductor layer 11 provided on a surface of a P-type silicon semiconductor substrate 10 of a semiconductor device is shaped in a plurality of projection columns thereby to have a plurality of steps. FIG. 8(a) is a sectional view of the semiconductor substrate for explaining an ion implantation method according to this embodiment, and FIG. 8(b) is a plan view of the semiconductor substrate as seen in the direction of projection of ions.

In this embodiment, a magnetic field B is applied so that an ion beam 71 travels spirally with a diameter D greater than a distance d between each two adjacent projection columns. If the magnetic field B is controlled so that the diameter D and the distance d satisfy a relationship d<D, the ions in the ion beam 71 reaching the surface of the substrate 10 are implanted into side walls of the projection columns of the semiconductor layer 11 at a higher probability. Therefore, the ion implantation to the side walls of the projection columns can effectively be achieved.

The distance d between the adjacent projection columns of the semiconductor layer 11 and the diameter D of the spiral motion are preferably about 1 nm to about 10 µm, but are not limited to this range.

In the plan views of FIGS. 7(b) and 8(b), the diameter D of the spiral motion of the ions increases toward the substrate 10, but may decrease toward the substrate 10 as shown in FIG. 8 or may be unchanged. The change in the diameter D of the spiral motion of the ions before the ions reach the silicon substrate after the projection of the ions is not particularly limited, as long as the ion implantation can be achieved as desired. FIGS. 8(a) and 8(b) illustrate the case where the ions to be implanted have a positive polarity. However, this embodiment is also applicable to a case where the ions to be implanted have a negative polarity.

According to the present invention, the electric field is applied to accelerate the ions in the one direction, and the magnetic field is applied parallel to the plane extending at the predetermined angle with respect to the one direction. Therefore, the ion implantation parallel to the surface of the semiconductor substrate can be controlled with high accuracy.

The magnetic field may be rotated parallel to the plane extending at the predetermined angle with respect to the direction of the application of the electric field, so that the ions travel spirally in the direction of the application of the electric field. Thus, the ions traveling spirally in the direction of the application of the electric field can be implanted into the side wall of the step not only in the one direction but also in all the other directions.

Where the magnetic field is applied so that the ions travel spirally with a diameter greater than a distance between every two adjacent projection columns of the semiconductor layer, the ions traveling spirally with the diameter greater than the distance between the adjacent projection columns are implanted into the side wall of the step at a higher probability. Thus, the ion implantation to the side wall of the step can effectively be achieved.

Where the electric field is applied parallel to the plane extending at the predetermined angle with respect to the substrate surface after the implantation ion atmosphere is formed on the protruded semiconductor layer on the semiconductor substrate, the ions in the implantation ion atmosphere are accelerated by the electric field thereby to be implanted into the side wall. Therefore, the ion implantation to the side wall can be controlled with high accuracy.

Where the electric field is rotated parallel to the surface of the semiconductor substrate, the ions are caused to travel spirally by the application of the electric field for the ion implantation. Therefore, the ions can be implanted into the side wall of the step not only in the one direction but also in all the other directions.

What is claimed is:

1. An ion implantation method for implanting ions into a side wall of a protruded semiconductor layer on a semiconductor substrate, which comprises
    applying an electric field to accelerate the ions in one direction and applying a magnetic field parallel to a plane extending at a predetermined angle with respect to the one direction, thereby controlling a direction of the ion implantation to the side wall;
    wherein the magnetic field is rotated parallel to the plane extending at the predetermined angle with respect to the electric field application direction so that the ions travel spirally in the electric field application direction.

2. An ion implantation method of claim 1, wherein the electric field is applied perpendicularly to a surface of the semiconductor substrate, and the magnetic field is applied parallel to the surface of the semiconductor substrate.

3. An ion implantation method of claim 1, wherein the protruded semiconductor layer includes a plurality of projection columns, and the magnetic field is applied so that the ions travel spirally with a diameter greater than a distance between each two adjacent projection columns.

4. An ion implantation method of claim 1, wherein the ions to be implanted are phosphorus ions.

5. An ion implantation method of claim 1, wherein a dose amount of the ions to be implanted is $1 \times 10^{10}$ cm$^{-2}$ to $1 \times 10^{16}$ cm$^{-2}$.

6. An ion implantation method of claim 1, wherein the electric field is applied so that each of the ions has kinetic energy of 1 keV to 5 MeV.

7. An ion implantation method of claim 1, wherein magnetic flux density of the magnetic field to be applied is 1 µT to 100 T.

8. An ion implantation method for implanting ions into a side wall of a protruded semiconductor layer on a semiconductor substrate, which comprises:
    applying a first electric field to form an implantation ion atmosphere on the vicinity of the protruded semiconductor layer on the semiconductor substrate; and
    applying a second electric field perpendicular to or at a predetermined angle with respect to the first electric field to accelerate the ions for the ion implantation to the side wall of the semiconductor layer.

9. An ion implantation method of claim 8, wherein the second electric field is rotated parallel to the surface of the semiconductor substrate.

10. An ion implantation method of claim 8, wherein the protruded semiconductor layer includes a plurality of projection columns.

11. An ion implantation method of claim 8, wherein the ions to be implanted are phosphorus ions.

12. An ion implantation method of claim 8, wherein a dose amount of the ions to be implanted is $1 \times 10^{10}$ cm$^{-2}$ to $1 \times 10^{16}$ cm$^{-2}$.

13. An ion implantation method of claim 8, wherein the formation of the implantation ion atmosphere is provided by applying the first electric field perpendicular to the substrate surface so that the ions are transported to the vicinity of the protruded semiconductor layer.

14. An ion implantation method of claim 13, wherein the first electric field is applied so that each of the ions has kinetic energy of 1 keV to 5 MeV.

15. An ion implantation method of claim 8, wherein the strength of the first electric field is 1 kV to 10 MV.

* * * * *

UNITED STATES PATENT AND TRADEMARK OFFICE
CERTIFICATE OF CORRECTION

PATENT NO. : 7,060,598 B2  Page 1 of 1
APPLICATION NO. : 10/918515
DATED : June 13, 2006
INVENTOR(S) : Fujio Masuoka et al.

It is certified that error appears in the above-identified patent and that said Letters Patent is hereby corrected as shown below:

On the cover page, in section (73) Assignee:

Please replace "Sharp Kabushiki Kaisha, Osaka (JP)"

with the following:

-- Sharp Kabushiki Kaisha, Osaka-shi (JP)
   Fujio Masuoka, Sendai-shi (JP) --.

Signed and Sealed this

Eleventh Day of September, 2007

JON W. DUDAS
*Director of the United States Patent and Trademark Office*